United States Patent
Kim et al.

(10) Patent No.: US 8,716,758 B2
(45) Date of Patent: May 6, 2014

(54) THIN FILM TRANSISTOR AND ORGANIC LIGHT-EMITTING DISPLAY

(75) Inventors: Jong-Yoon Kim, Yongin (KR); Il-Jeong Lee, Yongin (KR); Choong-Youl Im, Yongin (KR); Do-Hyun Kwon, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 170 days.

(21) Appl. No.: 13/103,938

(22) Filed: May 9, 2011

(65) Prior Publication Data

US 2012/0080681 A1 Apr. 5, 2012

(30) Foreign Application Priority Data

Oct. 1, 2010 (KR) .......................... 10-2010-0095958

(51) Int. Cl.
*H01L 29/76* (2006.01)

(52) U.S. Cl.
USPC .......................................... 257/213; 257/288

(58) Field of Classification Search
USPC .................................. 257/213, 288
See application file for complete search history.

(56) References Cited

U.S. PATENT DOCUMENTS

| 2009/0072227 A1* | 3/2009 | Ugawa et al. ................ 257/40 |
| 2009/0134393 A1* | 5/2009 | Gotoh et al. ................ 257/59 |
| 2010/0136722 A1* | 6/2010 | Kim et al. .................. 438/23 |

FOREIGN PATENT DOCUMENTS

| JP | 2003-317971 | 11/2003 |
| KR | 10-2006-0004877 | 1/2006 |
| KR | 10-0787461 | 12/2007 |
| KR | 10-2010-0022406 | 3/2010 |

* cited by examiner

*Primary Examiner* — Jae Lee
(74) *Attorney, Agent, or Firm* — Knobbe Martens Olson & Bear LLP

(57) ABSTRACT

A thin film transistor including: a substrate; an active layer formed over the substrate; a gate insulating layer formed over the active layer; a gate electrode formed over the gate insulating layer; an interlayer insulating layer formed over the gate electrode; and source and drain electrodes that contact the active layer via the interlayer insulating layer. The source and drain electrodes may have a structure including an aluminum (Al) layer, an aluminum-nickel alloy (AlNiX) layer, and an indium tin oxide (ITO) layer, which are sequentially stacked.

10 Claims, 4 Drawing Sheets

THIN FILM TRANSISTOR AND ORGANIC LIGHT-EMITTING DISPLAY

CROSS-REFERENCE TO RELATED APPLICATION

This application claims the benefit of Korean Patent Application No. 10-2010-0095958, filed on Oct. 1, 2010, in the Korean Intellectual Property Office, the disclosure of which is incorporated herein in its entirety by reference.

BACKGROUND

1. Field

The present technology relates to a thin film transistor (TFT) and an organic light-emitting device display including the same, and more particularly, to a TFT including source/drain electrodes having a uniform etching profile and an organic light-emitting display including the TFT.

2. Description of the Related Technology

Thin film transistors (TFTs) are a particular kind of field effect transistors manufactured by forming a semiconductor thin film on an insulating support substrate. A TFT typically includes a gate, a drain, and a source. TFTs are generally used in sensors, memory devices, and optical devices, and are mainly used as pixel switching devices or driving devices of flat panel displays.

Organic light-emitting displays are typically formed of materials that emit light when a voltage is applied thereto. Organic light-emitting displays have certain advantages over liquid crystal device (LCD) displays, such as a high luminance, wide viewing angles, and high response speeds. Organic light-emitting devices typically do not require a backlight, and thus can be made thin. An organic light-emitting display typically includes an organic light-emitting diode (OLED) and a TFT switching or driving the OLED.

The source and drain electrodes of TFTs used in organic light-emitting displays may have a double or triple-layered metal and/or metal oxide stack structure in consideration of emission direction, resistance, contact with an active layer, and contact with an electrode of an OLED. However, it can be difficult to etch a stack structure formed of materials having different etching properties to have a uniform profile using a single etchant.

SUMMARY

The present invention provides a thin film transistor (TFT) including source and drain electrodes having a stack structure with a uniform etching profile and an organic light-emitting display including the TFT.

According to an aspect of the present invention, a thin film transistor includes: a substrate; an active layer formed over the substrate; a gate insulating layer formed over the active layer; a gate electrode formed over the gate insulating layer; an interlayer insulating layer formed over the gate electrode; and source and drain electrodes that contact the active layer via the interlayer insulating layer.

The source and drain electrodes include an aluminum (Al) layer, an aluminum-nickel alloy (AlNiX) layer, and an indium tin oxide (ITO) layer, which are sequentially stacked. The X of the AlNiX layer may include lanthanum (La). The AlNiX layer may include about 95-98 at. % of Al, about 2-5 at. % of Ni, and about 0.2-1.0 at. % of X. The thickness of the Al layer may be in the range of 300 Å to 1000 Å, the thickness of the AlNiX layer may be in the range of 3000 Å to 6000 Å, and the thickness of the ITO layer may be in the range of 50 Å to 200 Å.

The active layer may be a silicon layer.

The thin film transistor may further include a storage capacitor including a lower capacitor electrode, a capacitor dielectric layer, and a upper capacitor electrode on the substrate. The lower capacitor electrode may be formed on the same layer as the active layer, the capacitor dielectric material may be formed on the same layer as the gate insulating layer, and the upper capacitor electrode may be formed on the same layer as the gate electrode.

The thin film transistor may further include a buffer layer between the substrate and the active layer.

According to another aspect of the present invention, a thin film transistor includes: a substrate; an active layer that is formed over the substrate and is a silicon layer having a nitrated surface; a gate insulating layer formed over the active layer; a gate electrode formed over the gate insulating layer; an interlayer insulating layer formed over the gate electrode; and source and drain electrodes. The source and drain electrodes contact the active layer via the interlayer insulating layer and include an aluminum-nickel alloy (AlNiX) layer and an indium tin oxide (ITO) layer, which are sequentially stacked.

According to another aspect of the present invention, a thin film transistor includes: a substrate; an active layer formed on the substrate; a gate insulating layer formed on the active layer; a gate electrode formed on the gate insulating layer; an interlayer insulating layer formed on the gate electrode; and source and drain electrodes. The source and drain electrodes contact the active layer via the interlayer insulating layer and include an aluminum-cobalt alloy (AlCoX) layer and an indium tin oxide (ITO) layer, which are sequentially stacked.

According to another aspect of the present invention, an organic light-emitting display includes: the thin film transistor; a pixel defining layer that is formed on the thin film transistor and exposes a drain electrode of the thin film transistor; and an organic light-emitting diode including an emission layer formed on the drain electrode and the pixel defining layer and a common electrode formed on the emission layer and the pixel defining layer.

BRIEF DESCRIPTION OF THE DRAWINGS

The above and other features and advantages of the present invention will become more apparent by describing in detail certain embodiments thereof with reference to the attached drawings in which.

DETAILED DESCRIPTION

Figure 1:
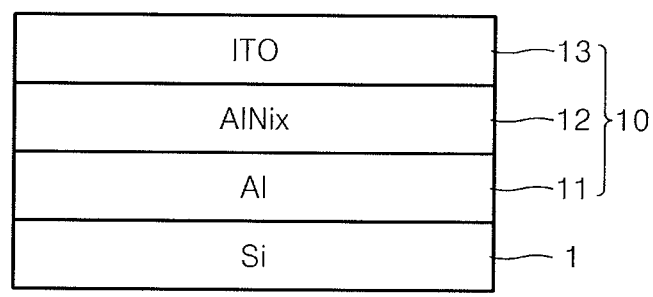
FIG. 1 illustrates a stack structure of source and drain electrodes of a thin film transistor (TFT) according to an embodiment of the present invention.

Hereinafter, embodiments of the present invention will now be described more fully with reference to the accompanying drawings. However, embodiments of the invention may be embodied in may different forms and should not construed as being limited to the descriptions set forth herein. Rather, these embodiments are provided so that the present disclosure is through and complete, and fully conveys the concept of the invention to those skilled in the art. In the accompanying drawings, thicknesses and sizes of layers and regions are not drawn to scale for illustration purposes. Like reference numerals in the drawings denote like elements.

FIG. 1 illustrates a stack structure 10 of source and drain electrodes of a thin film transistor (TFT) according to an embodiment of the present invention.

Referring to FIG. 1, the stack structure 10 of the source and drain electrodes may include an aluminum (Al) layer 11, an aluminum-nickel alloy (AlNiX) layer 12, and an indium tin oxide (ITO) layer 13, which are sequentially stacked on a silicon layer 1 that is an active layer.

The ITO layer 13, which is the uppermost layer of the source and drain electrodes and formed of a transparent conductive metal oxide, may function as an anode of an organic light-emitting diode (OLED). The ITO layer 13 may have a thickness in the range of 50 to 200 Å. Optionally, transparent conductive metal oxides, such as indium zinc oxide (IZO), tin oxide (TO) or zinc oxide (ZnO), may be used instead of the ITO.

The AlNiX is an alloy including Al, Ni, and a small amount of metal X. The metal X may be lanthanum (La). Al improves conductivity of the source and drain electrodes. Ni may form an $AlNi_3$ phase by heat-treatment to decrease interface resistance between the ITO layer 13 and the AlNiX layer 12, and the metal X may inhibit the formation of Al hillocks.

The AlNiX layer 12 may efficiently reduce contact resistance between the Al layer 11 and the ITO layer 13. If the ITO layer 13 directly contacts the Al layer 11, an Al oxide layer may be formed therebetween and the contact resistance can increase. However, if the AlNiX layer 12 is interposed between the Al layer 11 and the ITO layer 13, the Al oxide layer would not form, thereby reducing the contact resistance. The AlNiX layer 12 may reduce the contact resistance and narrow the distribution of the resistance.

The AlNiX layer 12 may contain about 95-98 at. % of Al, about 2-5 at. % of Ni, and about 0.2-1.0 at. % of the metal X. If the content of Al is less than 95% at. %, conductivity may be reduced. If the content of Ni is less than 2 at. %, interface resistance against the ITO may increase. If the content of the metal X is less than 0.2 at. %, Al hillocks may form.

The AlNiX layer 12 may have a thickness in the range of 3000 to 6000 Å. In addition, an aluminum cobalt alloy (AlCoGeX) may be used instead of the AlNiX. The metal X may be lanthanum (La).

The Al layer 11 may be formed of pure Al. If the AlNiX layer 12 directly contacts the silicon layer 1, as an active layer, Al may be diffused into silicon at the contact region by a subsequent heat-treatment at 250° C. or higher to cause a junction spike. Since the active layer into which Al is diffused becomes a conductor, the active layer cannot function as a TFT. However, if pure aluminum contacts silicon, a junction spike would not occur by the subsequent heat-treatment at 250° C. or higher. Accordingly, the Al layer 11 can inhibit the occurrence of a junction spike in the silicon layer 1.

In addition, if titanium (Ti) is formed on the bottom surface of the AlNiX layer 12, i.e., in an active layer/Ti/AlNiX/ITO stack structure, the ITO may protrude like a tip while etching the stack structure and the Ti can remain on the silicon layer like a tail. The ITO tip may form a high electric field around the tip and reduce the lifespan of the OLED. Alternatively, the ITO tip may be detached from the stack structure and become particles that generate dark spots. In addition, the Ti tail may decrease a margin of critical dimension (CD) to reduce substantial CD of an electrode, thereby increasing resistance.

However, if the Al layer 11 is formed on the bottom surface of the AlNiX layer 12, i.e., in an active layer/Al/AlNiX/ITO stack structure, the stack structure may be etched to have a gentle slope without an ITO tip or an Al tail. In other words, the active layer/Al/AlNiX/ITO stack structure may form source and drain electrodes having a good profile using a single etchant. Furthermore, the stack structure of the source and drain electrodes according to the present embodiment may facilitate the development of a phosphoric acid/nitric acid/acetic acid-based etchant to improve the etching profile.

Figure 2:
FIG. 2 is a scanning electron microscopic (SEM) image of the stack structure of the source and drain electrodes of FIG. 1 to show an etching profile of the stack structure.

FIG. 2 is a scanning electron microscopic (SEM) image of an Al/AlNiX/ITO stack structure 10 showing an etching profile, according to an embodiment of the present invention. The Al/AlNiX/ITO stack structure 10 shown in FIG. 2 was etched using phosphoric acid, nitric acid, and acetic acid-based etchants. As shown in FIG. 2, the Al/AlNiX/ITO stack structure 10 having a gentle positive slope may be formed on the silicon layer 1. The lower Al layer 11 may be formed on the silicon layer 1 without a tail, and the upper ITO layer 13 may be formed without a tip.

Figure 3:
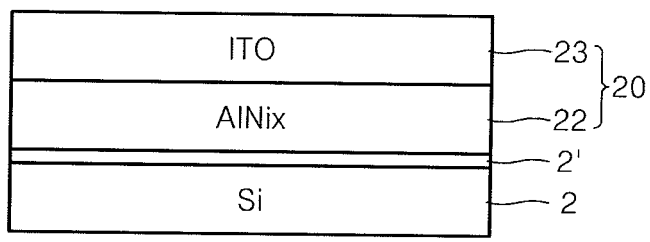
FIG. 3 illustrates a stack structure of source and drain electrodes of a TFT according to another embodiment of the present invention.

FIG. 3 illustrates a stack structure 20 of source and drain electrodes of a TFT according to another embodiment of the present invention.

Referring to FIG. 3, the stack structure 20 of the source and drain electrodes may include an aluminum-nickel alloy (AlNiX) layer 22 and an ITO layer 23, which may be sequentially stacked on a silicon layer 2 that is an active layer. Also, a nitrated silicon layer 2' may be formed on the surface of the silicon layer 2 between the silicon layer 2 and the AlNiX layer 22.

The ITO layer 23, which is the uppermost layer of the source and drain electrodes and is formed of a transparent conductive metal oxide, may function as an anode of an OLED. The ITO layer 23 may have a thickness in the range of 50 to 200 Å. Optionally, transparent conductive metal oxides, such as IZO, TO or ZnO, may be used instead of the ITO.

The AlNiX is an alloy including Al, Ni, and a small amount of metal X. The metal X may be lanthanum (La). Al can improve the conductivity of the source and drain electrodes. Ni can form an $AlNi_3$ phase by heat-treatment to decrease the interface resistance between the ITO layer 23 and the AlNiX layer 22, and the metal X may inhibit the formation of Al hillocks. The AlNiX layer 22 may reduce the contact resistance and narrow the distribution of resistance.

The AlNiX layer 22 may contain about 95-98 at. % of Al, about 2-5 at. % of Ni, and about 0.2-1.0 at. % of the metal X. If the content of Al is less than 95% at. %, the conductivity may decrease. If the content of Ni is less than 2 at. %, the interface resistance against ITO may increase. If the content of the metal X is less than 0.2 at. %, Al hillocks may occur. The AlNiX layer 22 may have a thickness in the range of 3000 to 6000 Å.

The silicon layer 2 may have the nitrated surface layer 2' formed thereon. The surface of the silicon layer 2 may be nitrated by treating the silicon layer 2 with plasma. The nitrated surface layer 2' of the silicon layer 2 may inhibit the diffusion of the Al of the AlNiX layer 22 into the silicon layer 2 and causing a junction spike. In this regard, the nitrated surface layer 2' of the silicon layer 2 may be very thin, for example, have a thickness of about 50 Å, and thus the nitrated surface layer 2' would not inhibit electric contact between the source and drain electrodes 20 and the silicon layer 2. Also, an aluminum cobalt alloy (AlCoGeX) may be used instead of the AlNiX. The metal X may be lanthanum (La).

Figure 4:
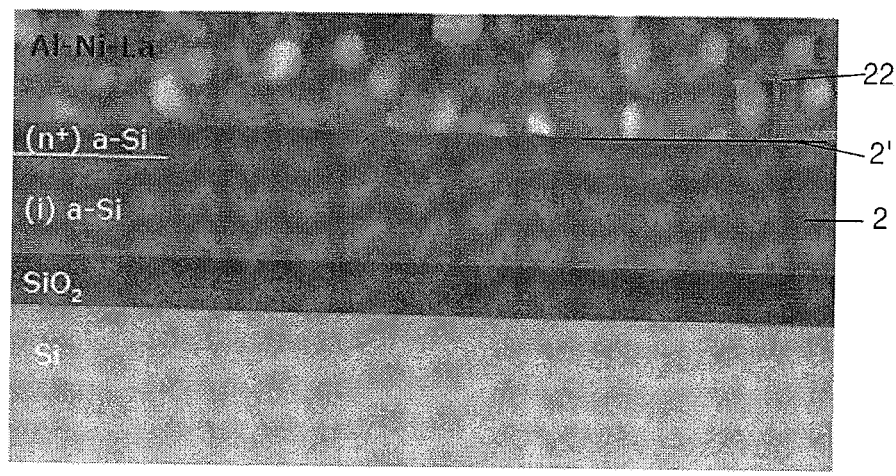
FIG. 4 is a transmission electron microscopic (TEM) image of a cross-section of a structure in which an AlNiLa layer is formed on a silicon layer having a nitrated surface.

FIG. 4 is a transmission electron microscopic (TEM) image of a cross-section of a structure in which an AlNiLa layer was formed on a silicon layer having a nitrated surface. The stack structure shown in FIG. 4 was formed by annealing at 300° C. for 30 minutes. Referring to the TEM image of FIG. 4, the junction spike was not formed in the silicon layer 2, because the surface 2' of the silicon layer 2 was nitrated and prevented the Al of the AlNiLa 22 from being diffused into the silicon layer 2.

Figure 5:
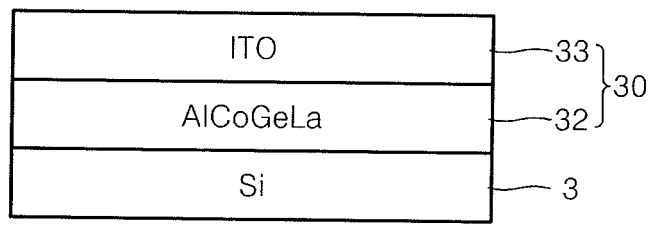
FIG. 5 illustrates a stack structure of source and drain electrodes of a thin film transistor (TFT) according to another embodiment of the present invention.

FIG. 5 illustrates a stack structure 30 of source and drain electrodes of a TFT according to another embodiment of the present invention. Referring to FIG. 5, the stack structure 30 of the source and drain electrodes includes an aluminum-cobalt alloy (AlCoX) layer 32 and an ITO layer 33, which are sequentially stacked on a silicon layer 3 that is an active layer.

The ITO layer 33, which is the uppermost layer of the source and drain electrodes and formed of a transparent conductive metal oxide, may function as an anode of an OLED. The ITO layer 33 may have a thickness in the range of 50 to 200 Å. Optionally, transparent conductive metal oxides, such as IZO, TO or ZnO, may be used instead of the ITO.

The AlCoX may be an alloy including Al, cobalt (Co), and a metal such as germanium (Ge) and La. For example, the AlCoX may be AlCoGeLa. Al can improve the conductivity of the source and drain electrodes. Co may decrease the contact resistance of the ITO layer 33, and the Ge and La may inhibit the formation of Al hillocks. In other words, the AlCoX layer 32 has excellent contact characteristics with the ITO layer 33 and does not cause a junction spike to occur in the interface with the silicon layer 3.

The AlCoX layer 32 may contain about 95-99 at. % of Al, about 0.1-0.5 at. % of Co, and about 0.3-1.5 at. % of the metal X. If X is GeLa, the content of Ge may be in the range of about 0.2 to about 1.0 at. %, and the content of the La may be in the range of about 0.1 to about 0.5 at. %. If the content of Al is less than 95% at. %, the conductivity may be reduced. If the content of Co is less than 0.1 at. %, the interface resistance against ITO may increase. If the content of the metal X is less than 0.3 at. %, Al hillocks may occur. The AlCoX layer 32 may have a thickness in the range of 3000 to 6000 Å.

Figure 6:
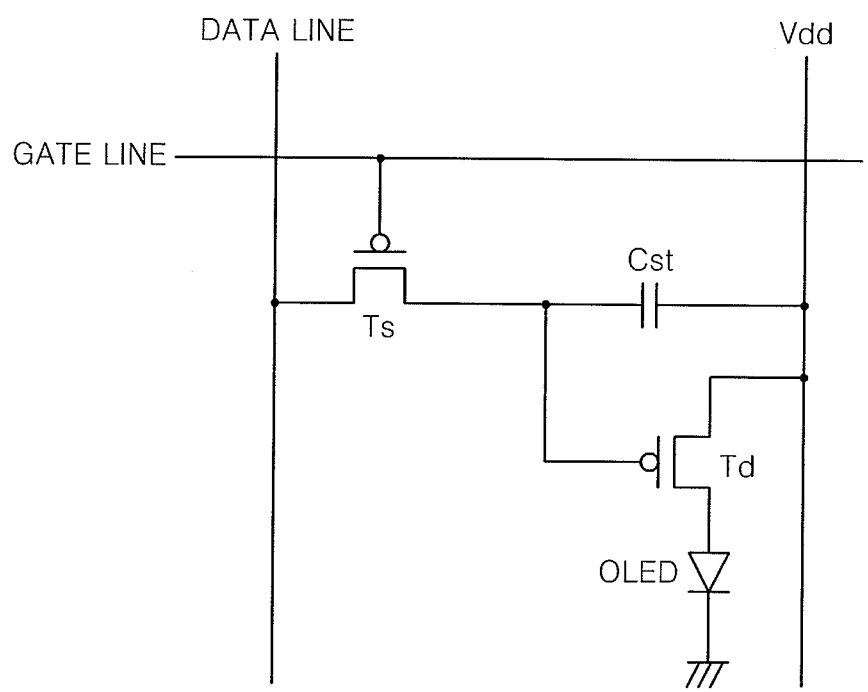
FIG. 6 is a schematic circuit diagram of a pixel of an organic light-emitting display according to an embodiment of the present invention.

FIG. 6 is a schematic circuit diagram of a pixel of an organic light-emitting display according to an embodiment of the present invention. Referring to FIG. 6, the pixel of the organic light-emitting display includes two TFTs including a switching transistor Ts and a driving transistor Td, a storage capacitor Cst and an OLED.

The switching transistor Ts may be turned on/off through a gate line by a gate signal and may transmit a data signal received through a data line to the storage capacitor Cst and the driving transistor Td.

The storage capacitor Cst can store the data signal transmitted from the switching transistor Ts for one frame period. The driving transistor Td can generate a driving current corresponding to a voltage difference between the data signal stored in the storage capacitor Cst and a driving voltage (Vdd) line.

The pixel of the OLED may include an anode that is connected to an output terminal of the driving transistor Td and a cathode to which a common voltage is applied, and emit light having different intensities according to the driving current of the driving transistor Td to display an image.

Also, the pixel of the organic light-emitting display may further include a signal line in addition to the gate line and the data line and devices in addition to the switching transistor Ts and the driving transistor Td.

Figure 7:
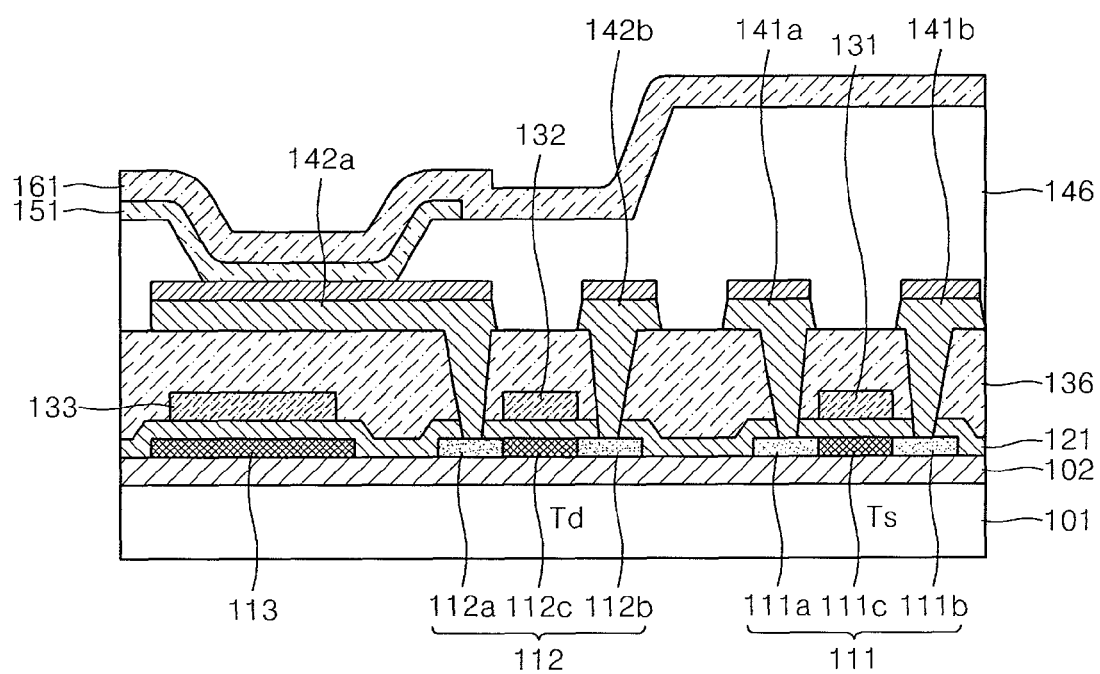
FIG. 7 is a schematic cross-sectional view of the organic light-emitting display of FIG. 6.

FIG. 7 is a schematic cross-sectional view of an organic light-emitting display according to an embodiment of the present invention.

Referring to FIG. 7, a buffer layer 102 is formed on a substrate 101. The substrate 101 may be formed of glass, quartz, or plastic, or any other material, such as silicon, ceramic, or metal. The buffer layer 102 may inhibit impurities, such as alkali ions from the substrate 101, from penetrating into a TFT. The buffer layer 102 may insulate an active layer from the substrate 101 if the buffer layer 102 contains mobile ions or if a conductive substrate is used. The buffer layer 102 may be formed of silicon oxide (SiOx), silicon nitride (SiNx), silicon oxynitride (SiONx), or the like.

An active layer 111 of the switching transistor Ts, an active layer 112 of the driving transistor Td, and a lower capacitor electrode 113 may be formed on the buffer layer 102. The active layers 111 and 112 may be formed of polycrystalline silicon, amorphous silicon, an oxide semiconductor, or an organic semiconductor material. The lower capacitor electrode 113 may be formed of the same material used to form the active layers 111 and 112.

The active layers 111 and 112 may include drain regions 111a and 112a and source regions 111b and 112b, which may be doped with a p-type semiconductor, and channel regions 111c and 112c between the drain regions 111a and 112a and the source regions 111b and 112b, respectively. In this regard, the positions of the drain regions 111a and 112a and the source regions 111b and 112b may be exchanged.

An insulating layer 121 may be formed on the active layers 111 and 112 and the lower capacitor electrode 113. The insulating layer 121 may be a single layer or a plurality of layers including a silicon oxide layer or a silicon nitride layer. The insulating layer 121 may function as a gate insulating layer on the active layers 111 and 112 and as a capacitor dielectric layer on the lower capacitor electrode 113.

Gate electrodes 131 and 132 and an upper capacitor electrode 133 may be formed on the insulating layer 121. The gate electrodes 131 and 132 may be formed of gold (Au), silver (Ag), copper (Cu), nickel (Ni), platinum (Pt), palladium (Pd), aluminum (Al), molybdenum (Mo), tungsten (W), titanium (Ti), or an alloy thereof. The upper capacitor electrode 133 may be formed of the same material used to form the gate electrodes 131 and 132.

An interlayer insulating layer 136 may be formed on the gate electrodes 131 and 132 and the upper capacitor electrode 133. The interlayer insulating layer 136 may be an insulating layer formed of silicon oxide or silicon nitride.

Source and drain electrodes 141a and 141b of the switching transistor Ts may penetrate the interlayer insulating layer 136 to contact the source and drain regions 111a and 111b of the active layer 111, and source and drain electrodes 142a and 142b of the driving transistor Td may penetrate the interlayer insulating layer 136 to contact the source and drain regions 112a and 112b of the active layer 112. The source and drain electrodes 141a, 141b, 142a, and 142b may include a stack structure according to embodiments of the present invention.

A pixel defining layer 146 that exposes the drain electrode 142a of the driving transistor Td may be formed on the source and drain electrodes 141a, 141b, 142a, and 142b and the interlayer insulating layer 136. The pixel defining layer 146 may be an organic or inorganic layer.

The stack structure 151 of the OLED may be formed to contact the drain electrode 142a of the driving transistor Td. The drain electrode 142a of the driving transistor Td may function as a pixel electrode. The stack structure 151 of the OLED may include an emission layer, and may further include a hole injection layer, a hole transport layer, an electron injection layer, or an electron transport layer.

A common electrode 161 may be formed on the stack structure 151 of the OLED. In a top-emission type display device, the common electrode 161 may be formed of a transparent conductive oxide, such as ITO and IZO. The common electrode 161 may also be a thin metal layer formed of Ni or chromium (Cr) or a stack structure including a transparent conductive oxide, such as ITO and IZO, and a metal, such as Ni or Cr. The common electrode 161 may function as a cathode supplying electrons into the stack structure 151 of the OLED.

Source and drain electrodes having a uniform etching profile by a single etchant may be manufactured by changing the materials of the stack structure of the source and drain electrodes, and an etchant for the stack structure of the source and drain electrodes may be developed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor comprising:
a substrate;
an active layer formed over the substrate;
a gate insulating layer formed over the active layer;
a gate electrode formed over the gate insulating layer;
an interlayer insulating layer formed over the gate electrode; and
source and drain electrodes that contact the active layer through openings in the interlayer insulating layer and comprise an aluminum (Al) layer, an aluminum-nickel alloy (AlNiX; where X is a metal) layer, and an indium tin oxide (ITO) layer, which are sequentially stacked over the active layer such that the Al layer is disposed between the ITO layer and the active layer.

2. The thin film transistor of claim 1, wherein the X of the AlNiX layer comprises lanthanum (La).

3. The thin film transistor of claim 1, wherein the AlNiX layer comprises about 95-98 at. % of Al, about 2-5 at. % of Ni, and about 0.2-1.0 at. % of X.

4. The thin film transistor of claim 1, wherein the Al layer has a thickness in the range of 300 Å to 1000 Å, the AlNiX layer has a thickness in the range of 3000 Å to 6000 Å, and ITO layer has a thickness in the range of 50 Å to 200 Å.

5. The thin film transistor of claim 1, wherein the active layer is a silicon layer.

6. The thin film transistor of claim 1, further comprising a storage capacitor comprising a lower capacitor electrode, a capacitor dielectric layer, and an upper capacitor electrode on the substrate.

7. The thin film transistor of claim 6, wherein the lower capacitor electrode is formed on the same layer as the active layer, the capacitor dielectric material is formed on the same layer as the gate insulating layer, and the upper capacitor electrode is formed on the same layer as the gate electrode.

8. The thin film transistor of claim 1, further comprising a buffer layer between the substrate and the active layer.

9. An organic light-emitting display comprising:
a thin film transistor according to claim 1;
a pixel defining layer that is formed on the thin film transistor and exposes a drain electrode of the thin film transistor; and
an organic light-emitting diode comprising a pixel electrode, the pixel electrode on the drain electrode of the thin film transistor, an emission layer formed on the pixel electrode and the pixel defining layer and a common electrode formed on the emission layer and the pixel defining layer.

10. The organic light-emitting display of claim 9, wherein the drain electrode functions as the pixel electrode of the organic light-emitting diode.

* * * * *